United States Patent [19]

Blaker et al.

[11] Patent Number: 5,513,220
[45] Date of Patent: Apr. 30, 1996

[54] DIGITAL RECEIVER WITH MINIMUM COST INDEX REGISTER

[75] Inventors: David M. Blaker, Emmaus; Gregory S. Ellard, Forest Park; Mohammad S. Mobin, Whitehall; Homayoon Sam, Wescosville, all of Pa.

[73] Assignee: AT&T Corp., Murray Hill, N.J.

[21] Appl. No.: 152,805

[22] Filed: Nov. 16, 1993

[51] Int. Cl.$^6$ .............................. H03D 1/00; H04L 27/06
[52] U.S. Cl. ......................... 375/340; 375/264; 375/261; 329/304
[58] Field of Search ................................ 375/39, 94, 99, 375/95, 261, 262, 263, 265, 340, 341; 371/41, 43, 44; 329/304, 307

[56] References Cited

U.S. PATENT DOCUMENTS

| | | | |
|---|---|---|---|
| 4,493,082 | 1/1985 | Cumberton et al. | 371/43 |
| 4,748,626 | 5/1988 | Wong | 371/30 |
| 5,151,904 | 9/1992 | Reiner et al. | 371/41 X |
| 5,185,747 | 2/1993 | Farahati | 371/43 |
| 5,220,570 | 6/1993 | Lou et al. | 371/43 |

OTHER PUBLICATIONS

"Chapter 4, Channel Coding," Mobile Radio Communications, R. Steel, ed.; by K. H. H. Wong and L. Hanzo, pp. 347–385.

*Primary Examiner*—Stephen Chin
*Assistant Examiner*—Bryan E. Webster
*Attorney, Agent, or Firm*—Richard D. Laumann; David L. Smith

[57] ABSTRACT

Convolutionally encoded information subjected to channel intersymbol interference is decoded by calculating the minimum cost path through a trellis. The trellis terminates in known states. Exploiting the open architecture of the coprocessor, the minimum cost state is checked to ascertain if it is the known, that is, correct state and if it is not, the possible known states are searched by the DSP inside the ECCP active register and the state with the lowest cost amont the possible states is selected.

10 Claims, 2 Drawing Sheets

DIGITAL RECEIVER WITH MINIMUM COST INDEX REGISTER

This application is related to the following concurrently filed, co-pending applications, each of which is incorporated herein by herein by reference:

Application Ser. No. 08/153,334, entitled "Efficient Utilization of Present State/Next State Registers", filed Nov. 16, 1993, by D. Blaker, M. Diamondstein, G. Ellard, M. Mobin, H. Sam and M. Thierbach, our docket number Blaker 3-2-3-3-4-10;

Application Ser. No. 08/152,531, entitled "Variable Length Tracebacks", filed Nov. 16, 1993, by D. Blaker, G. Ellard, and M. Mobin, our docket number Blaker 4-4-4;

Application Ser. No. 08/153,353, entitled "Power and Time Saving Initial Tracebacks", filed Nov. 16, 1993, by D. Blaker, G. Ellard, and M. Mobin, our docket number Blaker 6-6-6;

Application Ser. No. 08/152,405, entitled "Digital Processor and Viterbi Decoder Having Shared Memory", filed Nov. 16, 1993, by M. Diamondstein, H. Sam and M. Thierbach, our docket number Diamondstein 1-2-8;

Application Ser. No. 08/182,807, entitled "Digital Signal Processor", filed Nov. 16, 1993, by D. Blaker, G. Ellard, M. Mobin, and M. Thierbach, our docket number Blaker 5-5-5-9; and Application Ser. No. 08/153,391, entitled "Digital Signal Processor", filed Nov. 16, 1993, by D. Blaker, G. Ellard and M. Mobin, our docket number Blaker 1-1-1.

TECHNICAL FIELD

This invention relates generally to the field of digital receivers and particularly to such receivers using trellis decoding techniques.

Background of the Invention

Although telecommunications technology originally developed using copper wires as the transmission media, there is much interest and commercial activity in wireless technology using free space as the transmission media. Wireless technology frees the user from the physical constraint of needing an electrical connection to the transmission media, and is therefore extremely useful to people engaged in activities such as automobile driving.

Initial commercial activity developing wireless technology used analog transmission. In the interests of increasing the efficiency of spectrum utilization, digital transmission systems have been developed and it is certain that ultimately a majority of wireless telecommunications will utilize digital transmission systems. Digital systems transmit information as either 0s or 1s. Accurate information transmission depends upon being able to reliably detect transmitted 1s as 1s and 0s as 0s. Accurate detection is not always a simple matter because of factors such as low received signal power and multiple transmission paths caused by, for example, reflecting objects between the transmitter and receiver. Error correction techniques have been developed to increase the accuracy of digital communications systems.

Several techniques that have been developed or utilized to improve the accuracy of the communications system will be briefly described. The information may be convolutionally encoded; this encoding technique reduces the effects of burst channel noise by interleaving the bits of the data stream, that is, the transmitted information. Accuracy of transmission is further improved by the inclusion of encoded multiple bits, in place of single bits in the bit stream, which are used for error correction in the decoding process. An exemplary error correction scheme uses the Viterbi algorithm; use of the Viterbi algorithm is not, however, limited to convolutional codes. It is also applicable to maximum likelihood sequence estimation (MLSE) equalization and other coded bit streams. See, Mobile Radio Communications, R. Steele, ed., Chapter 4 Channel Coding by Wong and Hanzo for an exposition of convolutional encoding and the Viterbi algorithm.

The Viterbi decoder is a maximum likelihood decoder scheme that provides forward error correction. See, for example, U.S. Pat. 4,493,082 issued on Jan. 8, 1985 to Cumbertson et al for a description of a decoding scheme. Each state is represented by a plurality of bits; the number of possible states immediately preceding and following is limited. The permitted transitions from one state to another state are defined as a branch, and a sequence of interconnected branches is called a path. As mentioned, some transitions are not permitted; when the paths resulting from the non-permitted transitions are eliminated, computational efficiency with respect to decoding is improved. A branch metric is calculated for each branch and the accumulated metric is used to determine which paths survive and which do not survive.

More specifically, costs are calculated for each branch of the trellis. These costs are then used to calculate the costs for paths. The path through the trellis that is ultimately selected to represent the decoded information is the path that has the lowest cost. However, the lowest cost path may end in a state that is known to be not permitted. In this situation, the described technique produces an incorrect path through the trellis.

SUMMARY OF THE INVENTION

According to an exemplary embodiment of this invention, a receiver for digital communications is described which has a digital signal processor and an error correction coprocessor which is controlled by the digital signal processor. The coprocessor has a extremum cost index register. The means for decoding the received convolutionally encoded information calculates costs associated with paths through a trellis representing the possible states of the received encoded information. There are also means for writing the extremum cost and the state associated with the extremum cost into registers in the ECCP. Means for comparing the state with the extremum cost with permitted states then determines if the extremum cost state is a permitted state. If this state is not a permitted state, the means for writing writes the cost of the lowest cost permitted state into the extremum cost index register. This can be accomplished because there is an open architecture; that is, the DSP can directly access registers in the ECCP and change their contents if so desired. In a preferred embodiment, the extremum is a minimum.

DETAILED DESCRIPTION

Figure 1:
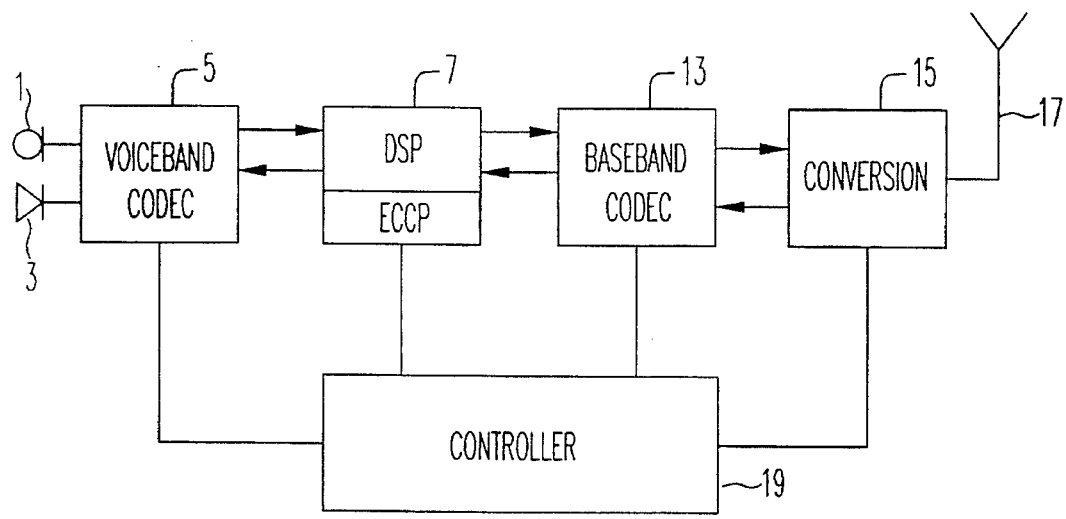
FIG. 1 is a block diagram showing a transceiver.

The invention will be described by reference to an exemplary embodiment which is a transceiver useful for telecommunications. FIG. 1 is a block diagram showing the transceiver which has speaker 1 and microphone 3 which are connected to voiceband codec 5. Codec 5 is connected to digital signal processor(DSP) 7 which has an embedded error correction coprocessor(ECCP). The DSP controls the ECCP, and the terminology commonly used to describe the relationship is master-slave. The DSP 7 is connected to baseband codec 13 which is connected to conversion unit 15. The conversion unit 15 performs frequency up and down conversion and sends signals to and receives signals from antenna 17. Controller 19 is attached to codec 5, DSP 7, codec 13, and conversion unit 15 as shown. As will be apparent from the following description, the architecture can be described as open; that is, the DSP can access and change registers within the ECCP. All of the elements depicted, except the DSP and ECCP, are well known to those skilled in the art, and will be readily implemented by such persons without further description. The DSP and ECCP need to be described in more detail to understand this invention.

The information received will typically be encoded information. A typical encoding technique is convolutional encoding which is used to reduce channel burst errors. An MLSE equalization is a means to mitigate the effecrts of intersymbol interference that can arise from several causes, such as multiple reflections, and must be reduced to increase the reliability of the communications system.

Figure 2:
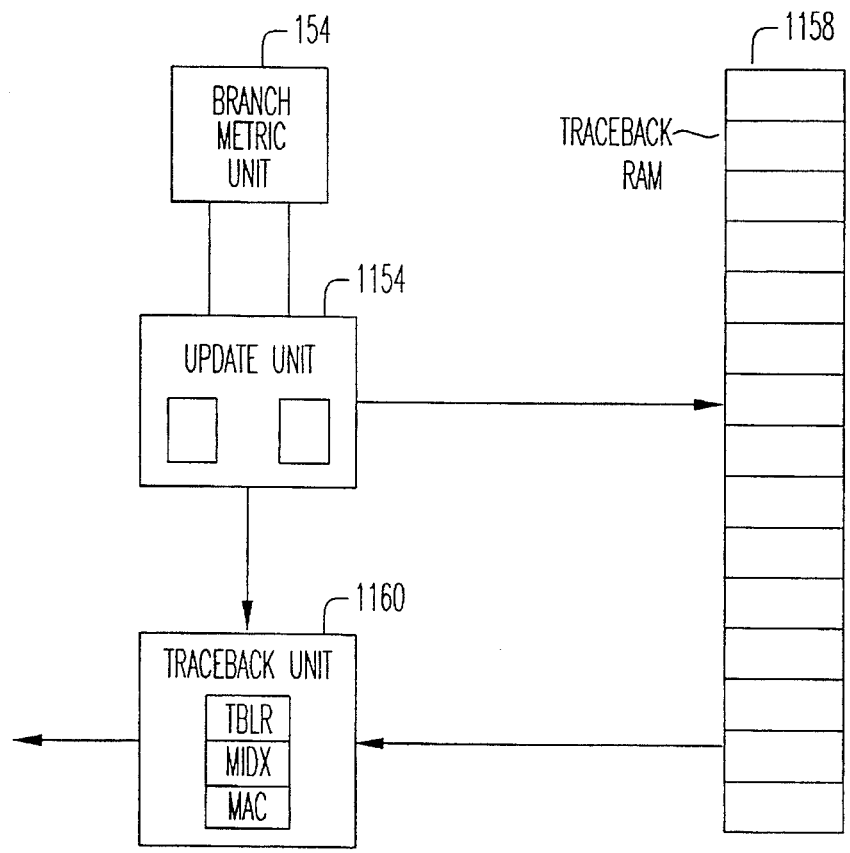
FIGS. 2 is a schematic diagram showing portions of the ECCP.

A portion of the ECCP is shown in more detail in FIG. 2. Branch metric unit 154 is connected to update unit 1154. This unit is connected to the traceback RAM 1158 and to the traceback unit 1160. Traceback RAM 1158 and the traceback unit 1160 are also connected. The traceback unit 1160 is also connected to the DSP which for reasons of simplicity is not shown here.

Operation of the elements described will be briefly described. The branch metric unit 154 transfers the branch metrics to the update unit 1154. The associated paths after an add-compare-select operation are written in the traceback RAM 1158. The minimum cost index is written into register MIDX of traceback unit 1160. The minimum accumulated cost is typically written into register MAC. The index of this cost is compared with the indices of the permitted states. If it is not the minimum cost state, the DSP rewrites the information in the MIDX register; that is, the cost index of the lowest cost permitted state is written into the minimum cost index register. This information is then used to execute the traceback. Finally, the output from the ECCP is the decoded symbol.

Figure 3:
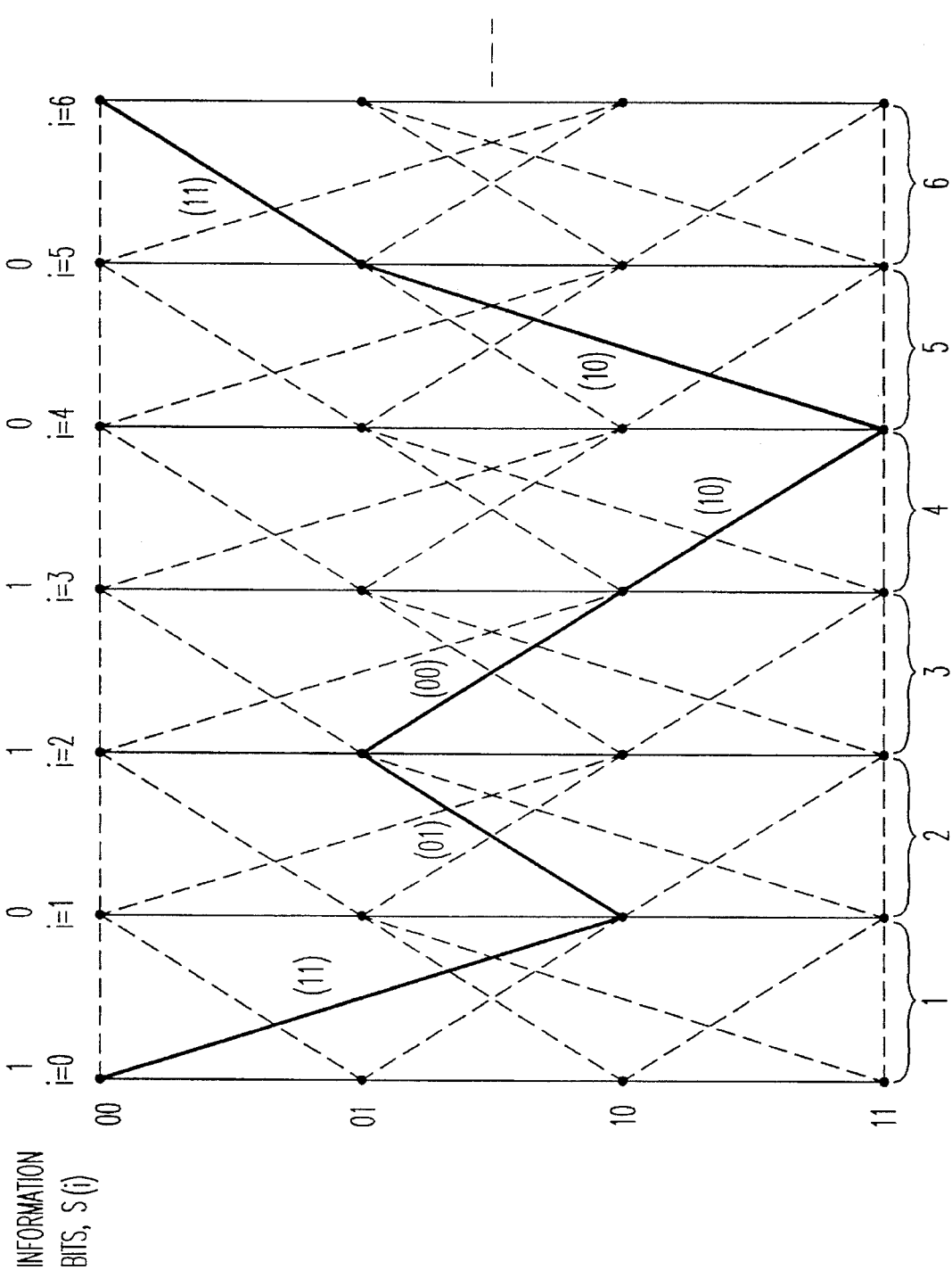
FIG. 3 is a trellis diagram useful in understanding minimum cost calculations for a path through the trellis.

The minimum cost is obtained by calculating the costs of a path through a trellis. This is better understood by consideration of FIG. 3 which is a trellis diagram for a constraint length of 3. The possible states are 00, 01, 10, and 11. The information bits are shown at the top. Depicted are a plurality of possible states; the most likely state transitions are shown by solid lines. Transitions that are not most likely are shown by the dotted lines. The costs for each state are calculated by methods that are well known in the art and both costs and the paths are stored in RAM.

In many data communications systems, known bits are transmitted at specified points in the data stream. For example, the GSM protocol has known bits, namely,three 0s, at both the beginning and end of each transmission. This information is utilized in this invention. After the minimum cost calculation has been completed, the final state associated with the minimum cost is checked to ascertain if it is accurate, that is, if it corresponds with the bits that were known to be transmitted. If it does not, the permitted or candidate state with the minimum cost is selected.

In contrast to prior art transceivers, transceivers according to this invention have means to access the internal cost registers. In particular, the DSP and ECCP have a mechanism to read the costs of the possible states through an address and data register pair. A write operation initializes the most likely state to a low cost and less likely states to high costs. A read operation can be performed to read the accumulated costs of the permitted states. In the DSP, a comparison is made between the state having the selected cost and the most likely final state. If necessary, the index associated with the most likely final state is written into the minimum cost index register thereby overriding the value selected by the ECCP.

In other words, the DSP has means for reading the minimum cost index register in the ECCP(MIDX). There are further means for reading the costs associated with possible candidate states and comparing their costs, in the DSP, and selecting the candidate state with the least cost. There are also means for writing the least cost index into the MIDX.

The minimum cost index register is for the early detection and correction of an error. This register provides a two-fold error correction methodology. The MLSE equalization mitigates the ISI and burst errors while this register allows a user to observe whether the MLSE equalization has done any error or not. This extra protection may be used in two different ways. First, if the MLSE equalizer induces an error then a user may force the decoding in the fight direction by reinitializing this register to the correct value (tail bits). Second, for power savings reasons, user will invoke adaptive MLSE equalization only if an error is detected in the vicinity of the left or right tail bits. Therefore, without waiting for the decoder to decode the whole sequence to understand whether an error has occurred or not, a user may detect an error at an earlier stage and may restart an adaptive equalization only if an error has occurred.

Commercially available Viterbi decoders are black boxes which take encoded inputs and outputs decoded symbols. The ECCP described allows users to detec error and conditionally guide decoding in the right direction.

Variations in the embodiments described will be readily thought of by those skilled in the art. For example, although a transceiver has been described, the transmitter functions may be omitted in some embodiments and the resulting device is a receiver. Additionally, although the description has been in terms of minimum cost, the metric could be inverted and maximum cost calculated. Thus, the cost index register is really an extremum cost index register.

We claim:

1. A receiver for digital communications comprising:

a digital signal processor;

an error correction coprocessor operatively coupled to the digital signal processor, said coprocessor being controlled by said digital signal processor, said coprocessor comprising an extremum cost index register;

means for calculating costs for received encoded information associated with paths through a trellis representing possible states of said encoded information sequence, said means producing an extremum cost;

means operatively coupled to the error correction coprocessor for writing said extremum cost of a state into said extremum cost index register; and means for comparing an index of said extremum cost state with indices of permitted states known to be transmitted, and when said index is not among the indices of permitted states known to be transmitted, writing the index of one of said extremum cost permitted state into said extremum cost index register.

2. A receiver as recited in claim 1 in which said extremum cost is a minimum cost.

3. A receiver as recited in claim 1 in which said means for calculating costs comprises means for decoding encoded information.

4. A receiver as recited in claim 2 in which said means for comparing further comprises means for reading said extremum cost index register of said error correction coprocessor.

5. A receiver as recited in claim 4 in which said means for comparing further comprises means for reading the costs associated with possible candidate states and comparing their costs, in the DSP, and selecting the candidate state with the next least cost.

6. A receiver as recited in claim 5 in which said means for comparing further comprises means for writing the cost index associated with the next least cost index into said extremum cost index register.

7. A method for determining the cost index of an extremum cost from a group of cost indices, some of which are known to be permitted extremum cost indices and others which are not permitted extremum cost indices, the method comprising the steps of:

receiving a sequence of encoded information;

calculating costs associated with the sequence of encoded information, the costs associated with paths through a trellis representing possible states of said sequence of encoded information;

selecting an extremum cost associated with a state;

identifying the cost index associated with the extremum cost;

comparing the cost index of the extremum cost to permitted extremum cost indices;

retaining the cost index of the extremum cost when it is among the permitted extremum cost indices; and selecting a cost index front among the permitted extremum cost indices when the cost index of the extremum cost is not among the permitted cost indices.

8. A method as recited in claim 7, wherein the step of selecting a cost index from among the permitted extremum cost indices when the cost index of the extremum cost is not among the permitted cost indices, comprises the step of:

selecting the cost index of the cost closest to the extremum cost.

9. A method as recited in claim 7, wherein the step of selecting a cost index from among the permitted extremum cost indices when the cost index of the extremum cost is not among the permitted cost indices, comprises the step of:

selecting the cost index of the minimum cost.

10. A method as recited in claim 7, further comprising the step of:

writing the extremum cost index into an extremum cost index register.

* * * * *